United States Patent
Najafi et al.

(10) Patent No.: US 12,052,093 B2
(45) Date of Patent: Jul. 30, 2024

(54) CLOCK CALIBRATION IN A COMPUTING SYSTEM USING TEMPERATURE SENSORS

(71) Applicant: VMware LLC, Palo Alto, CA (US)

(72) Inventors: Ali Najafi, Seattle, WA (US); Michael Wei, Palo Alto, CA (US); Andreas Georg Nowatzyk, San Jose, CA (US); Amy Tai, Mountain View, CA (US)

(73) Assignee: VMware LLC, Palo Alto, CA (US)

( * ) Notice: Subject to any disclaimer, the term of this patent is extended or adjusted under 35 U.S.C. 154(b) by 176 days.

(21) Appl. No.: 17/478,063

(22) Filed: Sep. 17, 2021

(65) Prior Publication Data
US 2023/0089659 A1    Mar. 23, 2023

(51) Int. Cl.
*H04J 3/06*    (2006.01)
*G06F 1/14*    (2006.01)
*G06F 11/30*    (2006.01)

(52) U.S. Cl.
CPC .............. *H04J 3/0667* (2013.01); *G06F 1/14* (2013.01); *G06F 11/3058* (2013.01)

(58) Field of Classification Search
CPC ....... H04J 3/0667; G06F 1/14; G06F 11/3058
USPC ....................................................... 370/503
See application file for complete search history.

(56) References Cited

U.S. PATENT DOCUMENTS

| | | | |
|---|---|---|---|
| 2011/0028166 A1* | 2/2011 | Ketchum | H04J 3/0688 370/316 |
| 2020/0404607 A1* | 12/2020 | Charipadi | H04W 56/0015 |

OTHER PUBLICATIONS

Corbett, James C., et al. "Spanner: Google's globally distributed database." ACM Transactions on Computer Systems (TOCS) 31.3 (2013): pp. 1-22.
Li, Yuliang, et al. "Sundial: Fault-tolerant clock synchronization for datacenters." 14th {USENIX} Symposium on Operating Systems Design and Implementation ({OSDI} 20). 2020, 17 pages.

* cited by examiner

*Primary Examiner* — Faisal Choudhury
(74) *Attorney, Agent, or Firm* — Quarles & Brady LLP (57) ABSTRACT

Described herein are systems, methods, and software to manage time calibration associated with an oscillator of a computing system. In one example, a computing system monitors clock cycles for an oscillator on the computing system, receives timing messages from a server, and calculates the frequency of the oscillator at intervals based on the monitored clock cycles and timing messages. The computing system further identifies a temperature from a temperature sensor at each of the intervals and generates a function to demonstrate frequency of the oscillator versus temperatures from the temperature sensor based on the identified temperatures and frequencies at the intervals.

20 Claims, 6 Drawing Sheets

CLOCK CALIBRATION IN A COMPUTING SYSTEM USING TEMPERATURE SENSORS

TECHNICAL BACKGROUND

Computing systems employ crystal oscillators or oscillators to provide clock frequencies to at least one processing system on each of the computing systems. The oscillators use the mechanical resonance of a vibrating crystal or piezoelectric material to create an electrical signal that is received by the processing systems. This signal is then used to trigger the processing of instructions, the retrieval of data, communications with other computing systems, or some other operation.

In some implementations, the frequency that is generated by an oscillator in a computing system can be affected by different variables associated with the computing system. The variables may include temperature, mechanical vibration, voltage, humidity, or some other variable. Specifically, based on changes in the variables, the frequency from an oscillator may increase or decrease, changing the timing of operations provided by a processing system. This can cause adverse effects when applications or communications require accurate timings for their application.

SUMMARY

The technology described herein manages clock calibration in a computing system using temperature sensors. In one example, a method of operating a computing system to compensate for fluctuations in a frequency from an oscillator includes monitoring clock cycles for an oscillator at the computing system, receiving timing messages from a second computing system, and calculating the frequency of the oscillator at a plurality of intervals based on the monitored clock cycles and the timing messages. The method further includes, at each of the plurality of intervals, identifying a temperature associated with the computing system from a temperature sensor of the computing system. The method also provides generating a function to demonstrate the frequency of the oscillator as a function of the temperature from the temperature sensor based on the frequencies and the temperatures at the plurality of intervals. Once the function is generated, the method includes identifying a first temperature from the temperature sensor, determining a first frequency for the oscillator based on the function, and calculating a frequency error from the first frequency to an expected frequency. In response to calculating the frequency error, the method further includes applying a compensation to the first frequency based on the frequency error.

DETAILED DESCRIPTION

Figure 1:
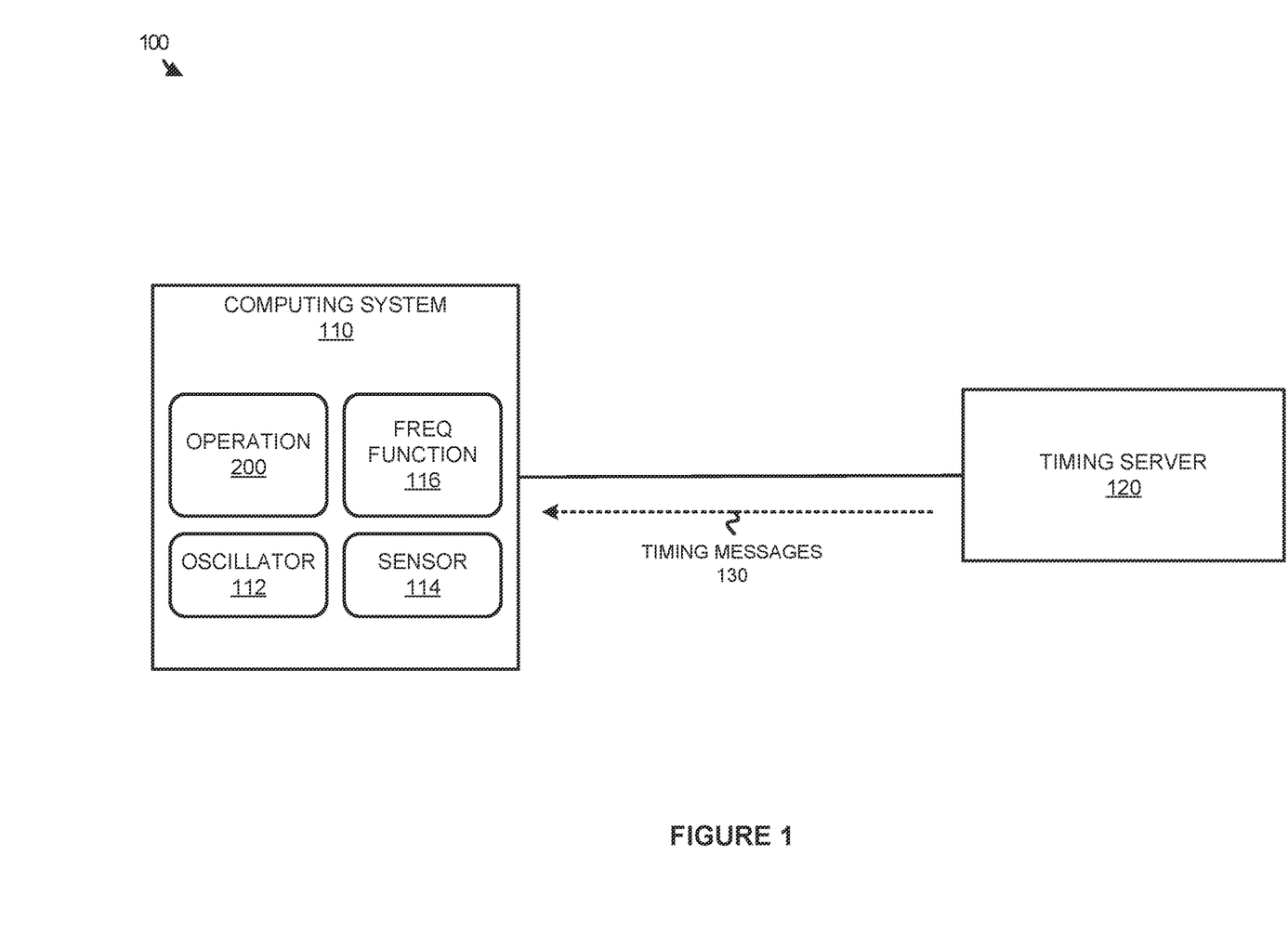
FIG. 1 illustrates a computing environment to manage clock calibration in a computing system based on a temperature sensor for the computing system according to an implementation.

FIG. 1 illustrates a computing environment 100 to manage clock calibration in a computing system based on a temperature sensor for the computing system according to an implementation. Computing environment 100 includes computing system 110 and timing server 120. Computing system 110 further includes frequency oscillator 112, temperature sensor 114, and function 116. Computing system provides operation 200 that is further described below in FIG. 2.

In computing environment 100, computing system 110 may include computing hardware, such as a power supply, motherboard, processing system, storage and memory, graphics components, or some other computer components. Computing system 110 further includes oscillator 112, that is used to provide an electronical signal or clock for the components on computing system 110. For example, a processing system may use the electronic signal from oscillator 112 to trigger the processing of instructions in the processing system. In addition to oscillator 112, temperature sensor 114 may be used to monitor temperatures associated with computing system 110, wherein temperature sensor 114 may be located on the motherboard, a secondary processing card or peripheral, the enclosure, or some other location within computing system 110. In some examples, temperature sensor 114 may represent a sensor of a plurality of temperature sensors, wherein temperature sensor 114 can be selected based on the proximity to oscillator 112. The selection may be based on the component types listed for the computing system, an administrator selection, or some other mechanism. For example, the administrator may be provided with a list of temperature sensors in computing system 110 and may provide a preference of the temperature sensor most relevant or closest to the oscillator.

During the operation of computing system 110, timing server 120 may provide timing messages 130 to computing system 110. Timing messages 130 may include network timing protocol (NTP) messages, precision time protocol (PTP) messages, pulse per second (PPS) time synchronization protocol messages, or some other timing protocol messages. Using timing messages 130, computing system 110 may calculate a frequency of oscillator 112 at intervals based on monitored clock cycles of oscillator 112 during the period between timing messages 130. For example, timing messages 130 may be received at one second intervals and the clock cycles can be monitored or counted for oscillator 112 during that one second interval. Based on the number of clock cycles during the second, a frequency can be determined for the oscillator during that period. Additionally, a temperature from the temperature sensor can be identified during the interval to generate a data point that correlates temperature of the computing system to frequency of the oscillator. The process can be repeated over multiple iterations or intervals to identify additional data points that correlate the frequency of the oscillator to temperature of the computing system.

Once the data points are identified for multiple intervals, computing system 100 may generate a function 116 using regression that relates the frequency of oscillator 112 to temperatures measured by temperature sensor 114. The function can then be used to calibrate or identify the error for the frequency of oscillator 112 in relation to an expected frequency. For example, an oscillator may have an expected frequency of 100 MHZ but may fluctuate due changes in temperature of the computing system. Function 116 may be used to identify these fluctuations and apply compensation to bring the frequency to a desired frequency, such as 100 MHZ.

Figure 2:
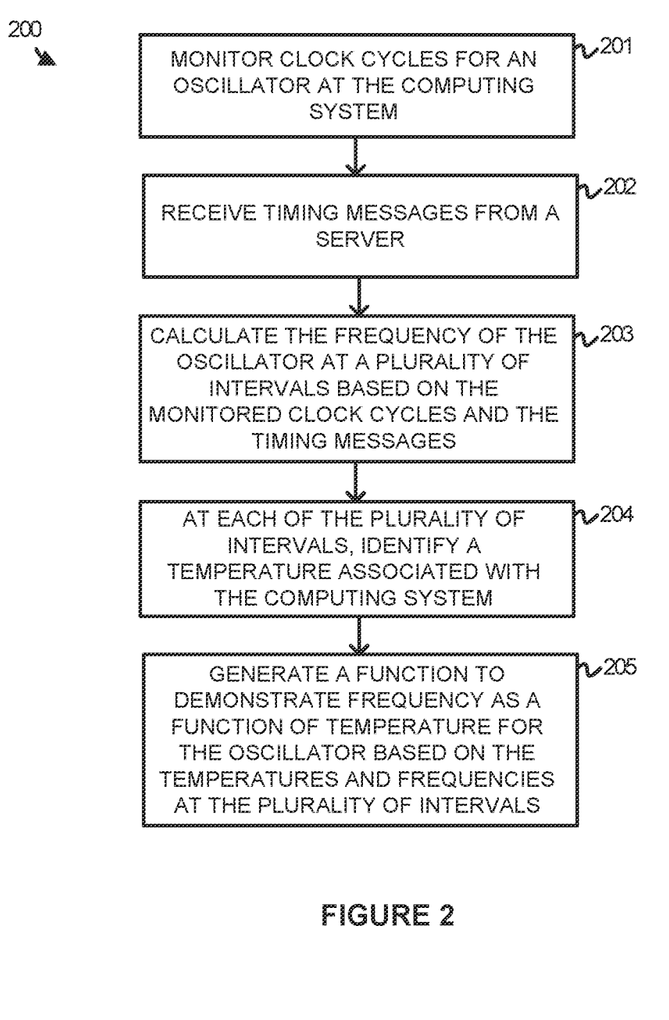
FIG. 2 illustrates an operation of the computing system to manage clock calibration based on a temperature sensor according to an implementation.

FIG. 2 illustrates an operation 200 of the computing system to manage clock calibration based on a temperature sensor according to an implementation. The steps of operation 200 are referenced parenthetically in the paragraphs that follow with reference to systems and elements of computing environment 100 of FIG. 1. Although demonstrated with a single computing system, similar operations may be performed by multiple individual computing systems in a computing environment (e.g., servers in a data center).

In providing operation 200, computing system 110 monitors (201) clock cycles for an oscillator at the computing system and receives (202) timing messages from a second computing system, such as timing server 120. Operation 200 further calculates (203) the frequency of the oscillator at a plurality of intervals based on the monitored clock cycles and the timing messages. In monitoring the clock cycles, computing system 110 may count the clock cycles output by oscillator 112 over a period associated with the timing messages from timing server 120. For example, timing server may provide timing messages 130 every second. Computing system 110 may count the clock cycles during the one second period and use the information to calculate a frequency for that one second period. Timing messages 130 may be provided using NTP, PTP, PPS, or some other timing protocol.

In addition to calculating the frequency at a plurality of intervals, operation 200 further, at each of the intervals, identifies (204) a temperature associated with the computing system from a temperature sensor of the computing system. The sensor may be located on the motherboard, on the enclosure, on an expansion card, or some other location in computing system 110. In some examples, temperature sensor 114 may be selected from a plurality of temperature sensors based on the proximity of the sensor to oscillator 112. For example, operation 200 may select the temperature sensor based on the types of components in the computing system (e.g., motherboard type). Once the frequencies and temperatures are identified at the intervals, operation 200 further generates (205) a function to demonstrate the frequency of the oscillator as a function of the temperature from the temperature sensor based on the frequencies and the temperatures at the plurality of intervals. In some implementations, the function may comprise a third-degree polynomial function, although other possible functions are possible. In some examples, the function may be determined using a polynomial regression that uses the data points from the intervals to predict the frequency as a function of the temperature. Specifically, for each of the intervals, computing system 110 may generate a data point that relates the temperature at the interval to a frequency at the interval. From the data points, computing system 110 may generate frequency function 116 that relates the frequency from oscillator 112 to the temperature identified by temperature sensor 114.

After frequency function 116 is generated by computing system 110, frequency function 116 may be used to estimate the current frequency from oscillator 112 based on a measured temperature from temperature sensor 114. In at least one example, computing system 110 may identify a first temperature from temperature sensor 114 and determine a first frequency for oscillator 112 based on the function. Specifically, the temperature may be inserted into the function to identify a resultant frequency. Once the first frequency is identified, computing system 110 may calculate a frequency error from the first frequency to an expected frequency for the oscillator. For example, an expected frequency for the oscillator may be 100 MHZ, while the first frequency based on the function identifies the frequency as 110 MHZ. Accordingly, the error would be identified as 10 MHZ. From the error, computing system 110 may apply compensation to the first frequency based on the frequency error. Using the previous example, computing system 110 may adjust the first frequency or compensate for the first frequency, such that the clock more accurately reflects the expected frequency.

In some implementations, the process is repeated to update the compensation for oscillator 112. For example, when computing system 110 applies a compensation for the first frequency, computing system 110 may initiate a timer. At the expiration of the timer, computing system 110 may identify a second temperature from temperature sensor 114 and identify a second frequency using the second temperature and the function. Computing system 110 may then apply a compensation to the second frequency to compensate for the error between the second frequency and the expected frequency associated with oscillator 112. The process may be repeated as required when the timer expires for the applied compensation.

In some examples, the generation of the function may use an initial operation period for the computing system. For example, data points may be generated every five minutes during the first day of operation for the computing system. From the data points, the initial function can be generated. The function can then be updated periodically, based on a request from an administrator, or based on some other triggering event to take additional data points or replacement data points for the function. Once the additional data points are identified, the function can be updated and used to estimate the frequency as a function of a measured temperature.

Figure 3:
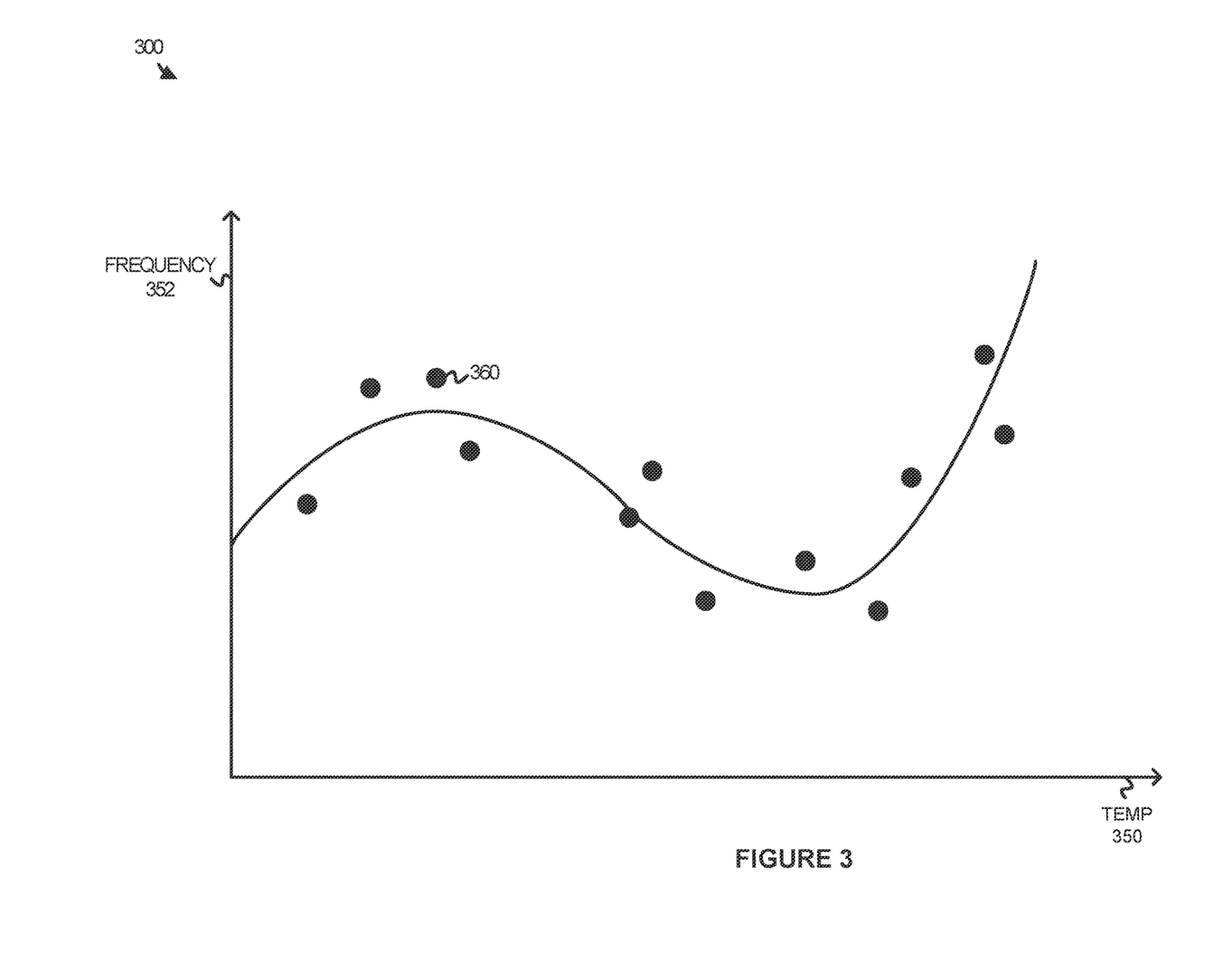
FIG. 3 illustrates a function of frequency from an oscillator versus temperature according to an implementation.

FIG. 3 illustrates a graph 300 of frequency from an oscillator versus temperature according to an implementation. Graph 300 is an example visual representation of a function generated using temperature information for a computing system in relation to frequency information for an oscillator on the computing system. Graph 300 includes a temperature axis 350 and frequency axis 352. An example data point is provided as data point 360.

As described herein, a computing system may, at intervals, calculate the frequency of an oscillator based on monitored clock cycles for the oscillator and timing messages from a second computing system. For example, two timing messages may define a known period (e.g., one second) and the number of clock cycles during that period can be divided by the known period to calculate the frequency during a first interval. The process can then be repeated at other intervals to calculate the frequency and identify multiple frequencies for the oscillator during the operation of the computing system. In addition to identifying frequencies from the oscillator at multiple intervals, the computing system will further identify a temperature from a temperature sensor at each of the intervals. Thus, for each interval, the computing system will identify a frequency for the interval and a temperature associated with the interval. The computing system can then use the information associated with each interval as a data point to generate a function that relates the temperature of the sensor to the frequency of the oscillator. For example, using data point 360, data point 360 represents a frequency and temperature measured during an interval of a plurality of intervals.

Once the data points are identified from the intervals, the computing system may use regression or polynomial regression to identify a function of frequency versus temperature. In some implementations, the function may comprise a third-degree polynomial based on the characteristics of oscillators; however, other regressions can be used. Once the function is generated, the function can be used compensate a frequency determined via temperature to an expected frequency for the oscillator.

In some implementations, the number of intervals to generate the function may be a set by an administrator. In some examples, the function may be updated using additional data points over the duration of the operation of the computing system. The intervals may be sequential, the intervals may random, or the intervals may be identified in some other manner. For example, when a computing system is initiated, the computing system may use timing messages from a timing server to generate multiple data points that generate the function. The timing messages may be delivered every second and the frequency may be monitored at five-minute intervals to determine the frequency associated with a current temperature. Thus, at a first time, the temperature and frequency can be calculated, and five minutes later a second temperature and frequency can be calculated. The data points can then be used to generate the function.

Figure 4:
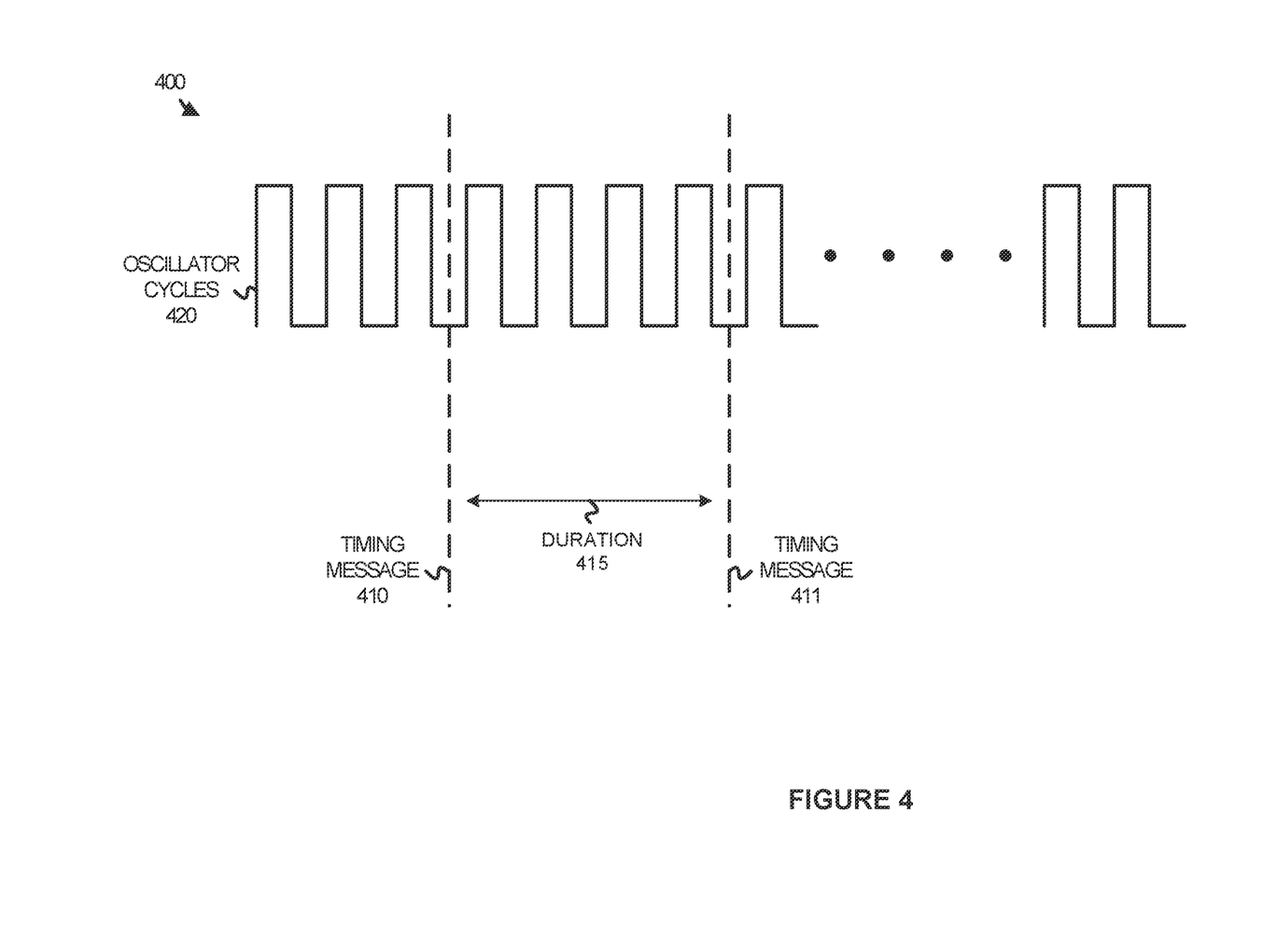
FIG. 4 illustrates an operational scenario of calculating frequency from an oscillator based on cycles and timing messages according to an implementation.

FIG. 4 illustrates an operational scenario 400 of calculating frequency from an oscillator based on cycles and timing messages according to an implementation. Operational scenario 400 includes oscillator clock cycles 420 (oscillator cycles), timing messages 410-411 and duration 415.

During the operation of a computing system, the computing system may receive, via a communication interface, timing messages from a timing server. These timing messages are controlled by the timing server to be delivered at intervals (e.g., one second intervals). Using the timing messages and counting the oscillator clock cycles between messages, the computing system can determine the frequency of the oscillator for the period between the timing messages. Using the example in operational scenario 400, timing messages 410-411 are received from a timing server with a duration of 415 between the messages. Timing messages 410-411 may be sequential timing messages or may have one or more messages between the timing messages. Between the timing messages, the computing system may count the number of clock cycles from the oscillator and divide the number of clock cycles by duration 415 to identify a frequency for the interval. At the same time, the computing system may retrieve a temperature from a temperature sensor and use the values to generate a data point. The process is then repeated for additional intervals and a function is developed using the plurality of data points.

Figure 5:
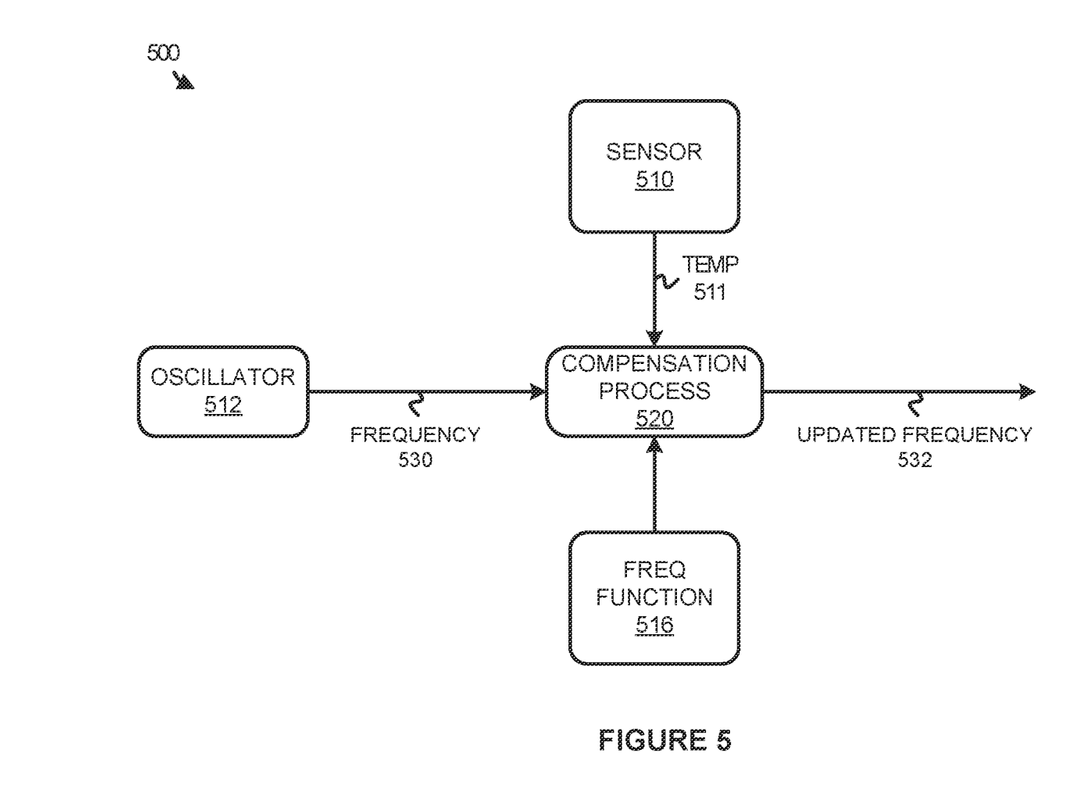
FIG. 5 illustrates an operational scenario of calculating a frequency error and compensation for an oscillator according to an implementation.

FIG. 5 illustrates an operational scenario 500 of calculating a frequency error and compensation for an oscillator according to an implementation. Operational scenario 500 includes sensor 510, oscillator 512, frequency function 516, and compensation process 520. Operational scenario 500 further includes frequency 530, updated frequency 532, and temperature 511.

In operational scenario 500, frequency function 516 is representative of a function generated from data points across a plurality of intervals. Each of the data points represents a temperature for a computing system during an interval and a frequency calculated for oscillator 512 during the interval. Frequency function 516 may represent a regression function, such as a polynomial function, that is generated from the data points representing the different intervals.

After frequency function 516 is generated, compensation process may receive temperature 511 from sensor 510. The temperature may be in Fahrenheit, Celsius, or some other temperature unit. In response to receiving temperature 511, compensation process 520 may apply frequency function 516 to determine a current frequency 530 from oscillator 512. Compensation process 520 then compares frequency 530 to an expected frequency from oscillator 512 and compensates or adjusts the frequency to generate updated frequency 532. For example, oscillator 512 may have an expected frequency of 100 MHZ, but frequency function 516 may indicate the frequency to be 115 MHZ based on temperature 511. Accordingly, compensation process 520 may compensate or calibrate the clock to adjust for the extra fifteen MHZ and provide applications with the expected frequency. In compensating, the computing system may use additional clock cycles to provide the expected signals, may use fewer clock cycles to provide the expected signals, may adjust the length of the clock from the oscillator, or may provide some other operation to adjust the clock to the proper frequency.

Figure 6:
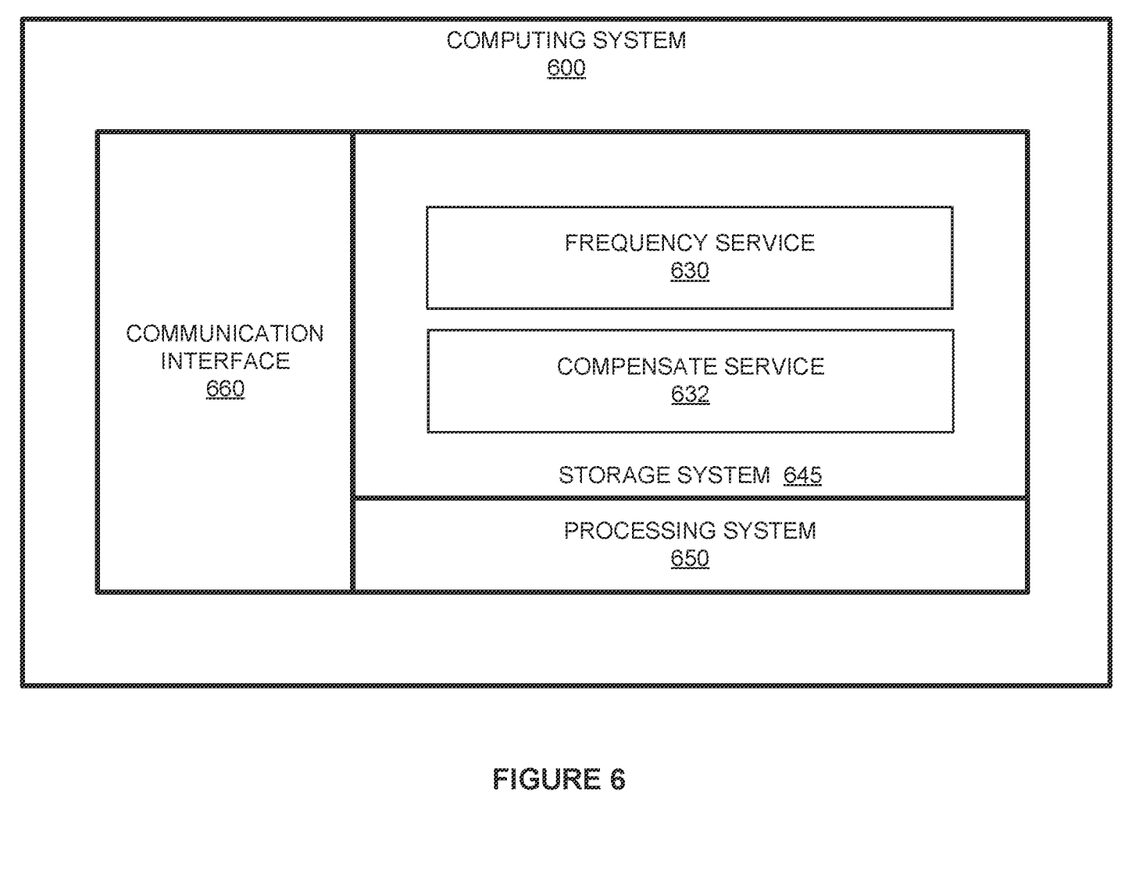
FIG. 6 illustrates a computing system to manage clock calibration based on a temperature sensor according to an implementation.

FIG. 6 illustrates a computing system 600 to manage clock calibration based on a temperature sensor according to an implementation. Computing system 600 is representative of any computing system or systems with which the various operational architectures, processes, scenarios, and sequences disclosed herein for a computing system can be implemented. Computing system 600 is an example of user computing system 110 of FIG. 1, although other examples may exist. Computing system 600 includes storage system 645, processing system 650, and communication interface 660. Processing system 650 is operatively linked to communication interface 660 and storage system 645. Communication interface 660 may be communicatively linked to storage system 645 in some implementations. Computing system 600 may further include other components such as a battery and enclosure that are not shown for clarity.

Communication interface 660 comprises components that communicate over communication links, such as network cards, ports, radio frequency (RF), processing circuitry and software, or some other communication devices. Communication interface 660 may be configured to communicate over metallic, wireless, or optical links. Communication interface 660 may be configured to use Time Division Multiplex (TDM), Internet Protocol (IP), Ethernet, optical networking, wireless protocols, communication signaling, or some other communication format—including combinations thereof. Communication interface 660 may be configured to communicate with at least a timing server capable of providing timing messages to the computing system. Communication interface 660 may further communicate with one or more other computing systems, such as desktop computing systems, server computing systems, laptop computing systems, mobile computing systems, or some other computing systems.

Processing system 650 comprises microprocessor and other circuitry that retrieves and executes operating software from storage system 645. Storage system 645 may include volatile and nonvolatile, removable and non-removable media implemented in any method or technology for storage of information, such as computer readable instructions, data structures, program modules, or other data. Storage system 645 may be implemented as a single storage device but may also be implemented across multiple storage devices or sub-systems. Storage system 645 may comprise additional elements, such as a controller to read operating software from the storage systems. Examples of storage media include random access memory, read only memory, magnetic disks, optical disks, and flash memory, as well as any combination or variation thereof, or any other type of storage media. In some implementations, the storage media may be a non-transitory storage media. In some instances, at least a portion of the storage media may be transitory. In no case is the storage media a propagated signal.

Processing system 650 is typically mounted on a circuit board that may also hold the storage system. The operating software of storage system 645 comprises computer programs, firmware, or some other form of machine-readable program instructions. The operating software of storage system 645 comprises latency monitoring service 630 that can provide at least operations 200 and 600 of FIGS. 2 and 6, respectively. The operating software on storage system 645 may further include an operating system, utilities, drivers, network interfaces, applications, or some other type of software. When read and executed by processing system 650 the operating software on storage system 645 directs computing system 600 to operate as described herein.

Although not depicted in FIG. 6, processing system 650 may be communicatively coupled to at least one temperature sensor that can provide temperatures to the processing system. The temperature sensor may be located on the motherboard, the chassis, a paraphernal device, or some other location in computing system 600. Additionally, although not depicted in computing system 600, processing system 650 may be coupled to an oscillator capable of providing a clock frequency to processing system 650.

In at least one implementation, frequency service 630 directs processing system 650 to monitor clock cycles for the oscillator of computing system 600. In some implementations, frequency service 630 may count the clock cycles as part of the monitoring processing. In addition to monitoring the clock cycles from the oscillator, frequency service 630 further directs processing system 650 to receive timing messages from a second computing system, such as a timing server. The second computing system may communicate with computing system 600 using NTP, PTP, PPS, or some other timing protocol. As an example, the second computing system may provide timing messages at one second increments, wherein the second computing system may include hardware and/or software that is used to provide an accurate timing signal to other computing systems. As the timing messages are received from the second computing system, frequency service 630 further directs processing system 650 to calculate the frequency of the oscillator at a plurality of intervals based on the monitored clock cycles and the timing messages. For example, the timing messages may be provided from the second computing system at five-minute intervals. During the five-minute interval, processing system 650 may monitor or count the clock cycles from the oscillator and divide the counted number of clock cycles by the period between the timing messages to find a frequency for the oscillator during the period or interval.

In addition to determining a frequency for the oscillator during the interval, frequency service 630 will direct processing system 650 to, at each of the plurality of intervals, identify a temperature associated with the computing system from a temperature sensor of the computing system. For example, during an interval, processing system 650 may obtain a temperature for the interval and use the temperature and the frequency to generate a data point for the interval.

Once the temperatures and frequencies are identified for the plurality of intervals, frequency service 630 will direct processing system 650 to generate a function to demonstrate the frequency of the oscillator as a function of the temperature from the temperature sensor based on the frequencies and the temperatures at the plurality of intervals. In some examples, the function may comprise a regression function that is generated from the data points of the intervals. The regression function may comprise a polynomial regression function, such as a third order regression function, that determines a "best fit" function for the data points at the different intervals. In some examples, the type of function selected may be based on the data sheet for the oscillator, wherein oscillators may reflect a third-degree polynomial function for the variance in frequency to temperature. As an illustrative example, the timing messages from the timing server may be communicated to computing system 600 at one second intervals and the frequency may be calculated at each of the one second intervals. Additionally, computing system 600 may determine the temperature of the computing system at each of the one second intervals and use the combination of the temperature and frequency to generate a data point that can be used in generating the function.

After generating the function, compensate service 632 directs processing system 650 to identify a first temperature from the temperature sensor and determine a first frequency for the oscillator based on the function. Compensate service 632 further directs processing system 650 to calculate a frequency error between the first frequency and an expected frequency for the oscillator and applies a compensation to the first frequency based on the frequency error. For example, the first frequency may be faster than the expected frequency for the oscillator. Accordingly, compensation service 632 may direct processing system 650 to compensate for the faster frequency and indicate a slower frequency to the required applications. This may include adjusting the clock cycles using hardware and/or software or providing some other operation to compensate for the error between the first frequency and the expected frequency.

In some implementations, the compensation operation may be executed periodically, based on changes in the temperature of the computing system, or at some other interval. As an example, compensation service 632 may direct processing system 650 to update the error associated with the frequency of the oscillator periodically, such as every minute. In other examples, compensation service 632 may monitor for changes in the temperature associated with computing system 600 to determine when the change satisfies criteria. If the change does not satisfy criteria, then the error may continue to be used to determine the compensation. If the error does satisfy the criteria, then the error may be recalculated using the previously described operations and a new compensation may be determined using the function.

In some implementations, the function may be updated progressively during the operation of computing system 600. For example, computing system 600 may calculate a first function using a first set of data points from first intervals. This function may be updated periodically, such as every twenty-four hours, or may be updated at some other interval. In some examples, when a computing system is initiated, the computing system may perform the operations described herein to identify changes in the frequency in relation to the temperature of the computing system. The length of the testing to determine the function may be based on an administrator rule, may be based on the type of temperature sensor used in the computing system, the type of oscillator used in the computing system, or some other factor. For example, an administrator may use the first week of operation of a computing system to determine the changes in the frequency of the oscillator in relation to the temperature of the computing system. Once an initial function is determined, the function can be used to identify a current frequency for the oscillator based on a current temperature measured at the sensor. The function can then be updated with additional data points or replaced by additional data points periodically, based on a request from an administrator, or at some other interval. The changes to the function may be caused by the uptime of the computing equipment, changes in environment for the computing system, or some other change to the system or environment of the computing system.

The included descriptions and figures depict specific implementations to teach those skilled in the art how to make and use the best mode. For teaching inventive principles, some conventional aspects have been simplified or omitted. Those skilled in the art will appreciate variations from these implementations that fall within the scope of the invention. Those skilled in the art will also appreciate that the features described above can be combined in various ways to form multiple implementations. As a result, the invention is not limited to the specific implementations described above, but only by the claims and their equivalents.

What is claimed is:

1. A method of operating a computing system to compensate for fluctuations in a frequency from an oscillator, the method comprising:
   monitoring clock cycles for an oscillator at the computing system;
   receiving timing messages from a second computing system;
   calculating the frequency of the oscillator at a plurality of intervals based on the monitored clock cycles and the timing messages;
   at each of the plurality of intervals, identifying a temperature associated with the computing system from a temperature sensor of the computing system;
   generating a function to demonstrate the frequency of the oscillator as a function of the temperature from the temperature sensor based on the frequencies and the temperatures at the plurality of intervals;
   after generating the function, identifying a first temperature from the temperature sensor;
   determining a first frequency for the oscillator based on the function;
   calculating a frequency error from the first frequency to an expected frequency; and
   applying a compensation to the first frequency based on the frequency error.

2. The method of claim 1, wherein the function comprises a third-degree polynomial function.

3. The method of claim 1, wherein the timing messages comprise a plurality of messages received using network timing protocol (NTP).

4. The method of claim 1, wherein the timing messages comprise a plurality of messages received using precision time protocol (PTP).

5. The method of claim 1, wherein generating the function to demonstrate the frequency of the oscillator as a function of the temperature from the temperature sensor based on the frequencies and the temperatures at the plurality of intervals comprises generating a polynomial regression function using data points each corresponding to a frequency and a temperature at an interval of the plurality of intervals.

6. The method of claim 5, wherein the polynomial regression comprises a third-degree polynomial.

7. The method of claim 1 further comprising:
   identifying an expiration of a period following the application of the compensation;
   in response to the expiration of the period, identifying a second temperature from the temperature sensor;
   determining a second frequency for the oscillator based on the function;
   calculating a second frequency error from the second frequency to the expected frequency; and
   applying a second compensation to the second frequency based on the second frequency error.

8. The method of claim 1 further comprising:
   selecting the temperature sensor from a plurality of temperature sensors based on the proximity of the plurality of temperature sensors to oscillator in the computing system.

9. The method of claim 1, wherein the computing system comprises a server computing system in a data center.

10. A computing apparatus comprising:
    a storage device;
    a processing device operatively coupled to the storage device; and
    program instructions stored on the storage device to compensate for fluctuations in a frequency of an oscillator in a computing system that, when executed by the processing device, direct the computing apparatus to:
    monitor clock cycles for an oscillator at the computing system;
    receive timing messages from a second computing system;
    calculate the frequency of the oscillator at a plurality of intervals based on the monitored clock cycles and the timing messages;
    at each of the plurality of intervals, identify a temperature associated with the computing system from a temperature sensor of the computing system;
    generate a function to demonstrate the frequency of the oscillator as a function of the temperature from the temperature sensor based on the frequencies and the temperatures at the plurality of intervals;
    after generating the function, identify a first temperature from the temperature sensor;
    determine a first frequency for the oscillator based on the function;
    calculate a frequency error from the first frequency to an expected frequency; and
    apply a compensation to the first frequency based on the frequency error.

11. The computing apparatus of claim 10, wherein the function comprises a third-degree polynomial function.

12. The computing apparatus of claim 10, wherein the timing messages comprise a plurality of messages received using network timing protocol (NTP).

13. The computing apparatus of claim 10, wherein the timing messages comprise a plurality of messages received using precision time protocol (PTP).

14. The computing apparatus of claim 10, wherein generating the function to demonstrate the frequency of the oscillator as a function of the temperature from the temperature sensor based on the frequencies and the temperatures at the plurality of intervals comprises generating a polynomial regression function using data points each corresponding to a frequency and a temperature at an interval of the plurality of intervals.

15. The computing apparatus of claim 14, wherein the polynomial regression comprises a third-degree polynomial.

16. The computing apparatus of claim 10, wherein the program instructions further direct the computing apparatus to:
identify an expiration of a period following the application of the compensation;
in response to the expiration of the period, identify a second temperature from the temperature sensor;
determine a second frequency for the oscillator based on the function;
calculate a second frequency error from the second frequency to the expected frequency; and
apply a second compensation to the second frequency based on the second frequency error.

17. The computing apparatus of claim 10, wherein the program instructions further direct the computing apparatus to:
select the temperature sensor from a plurality of temperature sensors based on the proximity of the plurality of temperature sensors to oscillator in the computing system.

18. The computing apparatus of claim 10, wherein the computing system comprises a server computing system in a data center.

19. The computing apparatus of claim 10, wherein the timing messages comprise a plurality of messages using pulse per second (PPS) time synchronization protocol.

20. A system comprising:
a timing server;
communicate timing messages to the computing system;
a computing system communicatively coupled to the timing server and configured to:
receive the timing messages;
monitor clock cycles for an oscillator at the computing system;
calculate the frequency of the oscillator at a plurality of intervals based on the monitored clock cycles and the timing messages;
at each of the plurality of intervals, identify a temperature associated with the computing system from a temperature sensor of the computing system;
generate a function to demonstrate the frequency of the oscillator as a function of the temperature from the temperature sensor based on the frequencies and the temperatures at the plurality of intervals;
after generating the function, identify a first temperature from the temperature sensor;
determine a first frequency for the oscillator based on the function;
calculate a frequency error from the first frequency to an expected frequency; and
apply a compensation to the first frequency based on the frequency error.

* * * * *